United States Patent
Tomioka (10) Patent No.: US 8,586,390 B2
(45) Date of Patent: Nov. 19, 2013

(54) METHOD FOR MANUFACTURING SEMICONDUCTOR DEVICE

(75) Inventor: Kazuhiro Tomioka, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 94 days.

(21) Appl. No.: 13/244,042

(22) Filed: Sep. 23, 2011

(65) Prior Publication Data

US 2012/0244641 A1    Sep. 27, 2012

(30) Foreign Application Priority Data

Mar. 23, 2011  (JP) .................................. 2011-065020

(51) Int. Cl.
    *H01L 21/00* (2006.01)
(52) U.S. Cl.
    USPC ............................................................ 438/3
(58) Field of Classification Search
    USPC ............................................................ 438/3
    See application file for complete search history.

(56) References Cited

U.S. PATENT DOCUMENTS

| | | | |
|---|---|---|---|
| 6,689,622 B1 * | 2/2004 | Drewes ............... | 438/3 |
| 6,884,731 B2 * | 4/2005 | Hwang et al. ................. | 438/709 |
| 7,042,705 B2 | 5/2006 | Zhuang et al. | |
| 7,115,522 B2 | 10/2006 | Tomioka et al. | |
| 7,400,005 B2 | 7/2008 | Kumura et al. | |
| 2007/0080381 A1 | 4/2007 | Chien et al. | |
| 2008/0265347 A1 | 10/2008 | Iwayama et al. | |
| 2009/0091863 A1 | 4/2009 | Hosotani et al. | |
| 2009/0314740 A1 | 12/2009 | Ikemoto et al. | |
| 2010/0097846 A1 | 4/2010 | Sugiura et al. | |

FOREIGN PATENT DOCUMENTS

| | | | |
|---|---|---|---|
| JP | 2007-053315 A | 3/2007 | |
| JP | 2007-110121 A | 4/2007 | |
| JP | 2008-294420 A | 12/2008 | |
| JP | 2009-094104 A | 4/2009 | |
| JP | 2009-302550 A | 12/2009 | |
| JP | 2010-103224 A | 5/2010 | |

OTHER PUBLICATIONS

Background Art Information, Toshiba, Jun. 6, 2011.

* cited by examiner

*Primary Examiner* — Luan C Thai
(74) *Attorney, Agent, or Firm* — Knobbe Martens Olson & Bear, LLP (57) ABSTRACT

According to one embodiment, a method for manufacturing a semiconductor device is disclosed. The device includes a magnetoresistance effect element using magnetic material containing at least one of cobalt, iron, and nickel. Forming the element includes forming a stacked body above a semiconductor substrate. The stacked body includes layers. The layers includes the magnetic material. Forming the element further includes processing the stacked body in a vacuum atmosphere by plasma etching using a first gas containing chlorine. Forming the element further includes subjecting the stacked body to a gas treatment using a second gas containing an amino group while holding the stacked body in the vacuum atmosphere.

17 Claims, 8 Drawing Sheets

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2011-065020, filed Mar. 23, 2011, the entire contents of which are incorporated herein by reference.

FIELD

Embodiments described herein relate generally to a method for manufacturing a semiconductor device with a magnetoresistance effect element using a magnetic material containing at least one of cobalt, iron, and nickel.

BACKGROUND

Magnetic random access memory (MRAM) is known as one of memory elements using magnetoresistance effect elements. The MRAM includes a magnetic tunnel junction (MTJ) element using a tunnel magnetoresistance (TMR) effect as a memory element. The MRAM stores information, depending on the magnetized state of the MTJ element.

There are several types of MRAMs. One of them is spin injection MRAM. In the case of spin injection MRAM, information is written by causing current to flow directly in the MTJ element and by changing the magnetization direction of a free layer according to the direction of current.

When such an MTJ element is formed, the layers to be processed into a shape of the MTJ element are formed in sequence by sputtering method. Thereafter, each of the layers is processed by reactive ion etching (RIE) method.

The each layers is as follows when describing them from the bottom: a layer to be processed into a lower electrode, a layer to be processed into a first fixed layer (also called a pin layer), a layer to be processed into a first tunnel barrier layer, a layer to be processed into a free layer (also called a recording layer), a layer to be processed into a second tunnel barrier layer, a layer to be processed into a second fixed layer, and a layer to be processed into an upper electrode.

However, in the spin injection MRAM obtained by conventional method for forming the MTJ element, reduction of signal amount is observed and desired signal amount is not obtained.

DETAILED DESCRIPTION

In general, according to one embodiment, a method for manufacturing a semiconductor device is disclosed. The semiconductor device comprises a magnetoresistance effect element using magnetic material containing at least one of cobalt, iron, and nickel. Forming the element comprises forming a stacked body above a semiconductor substrate, the stacked body comprising a plurality of layers comprising the magnetic material. The forming the device further comprises processing the stacked body in a vacuum atmosphere by plasma etching using a first gas containing chlorine. The forming the device further comprises subjecting the stacked body to a gas treatment using a second gas containing an amino group while holding the stacked body in the vacuum atmosphere.

According to one embodiment, a method for manufacturing a semiconductor device is disclosed. The semiconductor device comprises a magnetoresistance effect element using magnetic material containing at least one of cobalt, iron, and nickel. Forming the element comprises forming a first layer including the magnetic material. The forming the device further comprises forming a second layer comprising the magnetic material above the first layer. The forming the device further comprises forming a stopper film between the first layer and the second layer, the stopper film having resistance to plasma etching using a first gas containing chlorine. The forming the device further comprises processing the second layer by the plasma etching. The forming the device further comprises processing the first layer by ions, the ions being generated by ionizing second gas precluding chlorine.

Figure 1:
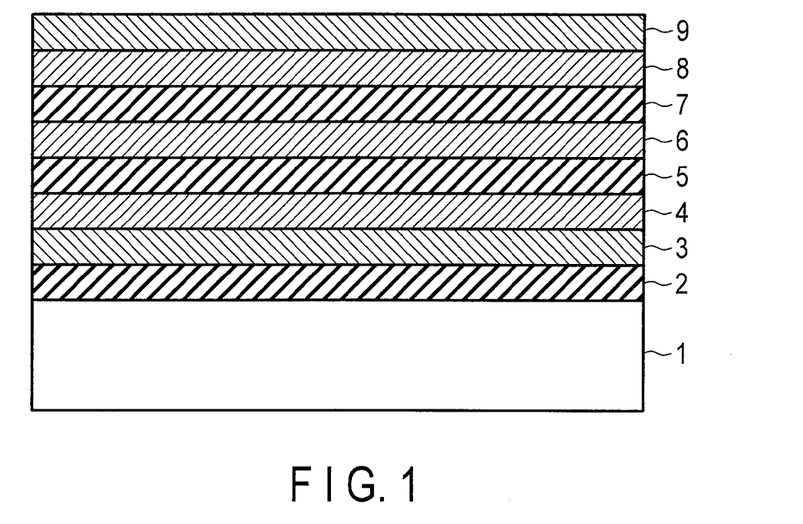
FIG. 1 is a sectional view to explain a method for manufacturing a semiconductor device including an MTJ element according to a first embodiment.

(First Embodiment)
[FIG. 1]

In FIG. 1, numeral 1 indicates a silicon wafer (semiconductor substrate), and a select transistor (not shown) is formed on a surface of the silicon wafer 1. This select transistor is an element for selecting a spin injection MTJ element. Hereinafter, a method for forming the MTJ element according to the present embodiment will be explained in detail.

An interlayer insulating film 2 is formed on the silicon wafer (semiconductor substrate) 1. Next, on the interlayer insulating film 2, layers 3 to 9 (MTJ stacked films) constituting the MTJ element are formed in sequence by, for example, sputtering method. The size of the MTJ is equal to 100 nm or less.

Specifically, the layers 3 to 9 are as follows. That is, numeral 3 indicates a lower electrode, 4 indicates a first fixed layer (pin layer), 5 indicates a first tunnel barrier (nonmagnetic layer), 6 indicates a free layer (recording layer), 7 indicates a second tunnel barrier layer (nonmagnetic layer), 8 indicates a second fixed layer (pin layer), and 9 indicates an upper electrode 9.

Ferromagnetic layers are used as the first fixed layer 4, the second fixed layer 8, and the free layer 6. For example, each of the first fixed layer 4 and the second fixed layer 8 is a ferromagnetic layer containing at least one of elements among cobalt (Co), iron (Fe), nickel (Ni), iridium (Ir), platinum (Pt), manganese (Mn), and ruthenium (Ru). The free layer 6 is a ferromagnetic layer containing at least one of elements among cobalt (Co), iron (Fe), and nickel (Ni). To adjust saturated magnetization, crystal magnetic anisotropy, or the like, for example, an element such as boron (B), carbon (C), or silicon (Si) may be added to the free layer 6.

A conducting layer made of, for example, Pt, Ir, or ruthenium (Ru) is used as each of the lower electrode 2 and upper electrode 9.

Figure 2:
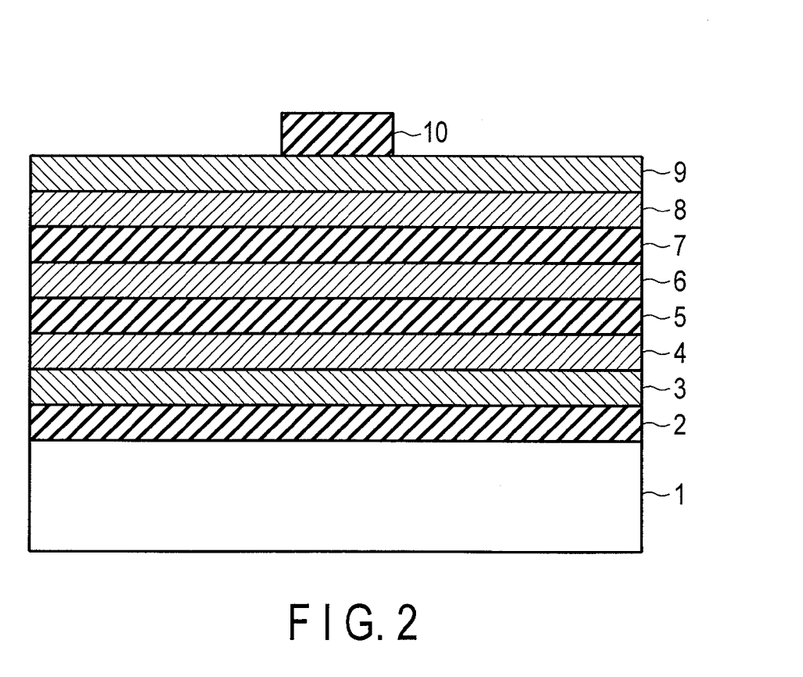
FIG. 2 is a sectional view to explain the method for manufacturing the semiconductor device including the MTJ element according to the first embodiment following FIG. 1.

[FIG. 2]

A hard mask 10 is formed on the upper electrode 9. The process of forming the hard mask 10 includes a step of forming a silicon oxide film to be processed into a hard mask by CVD method and a step of forming a resist film on the silicon oxide film and processing the resist film by photolithography method and etching method. The etching method at this time is reactive ion etching (RIE) method (plasma etching method) using fluorocarbon gas containing $CF_4$, $CHF_3$, $C_4F_8$, or $C_4F_4$ as an etching gas (source gas).

Figure 3:
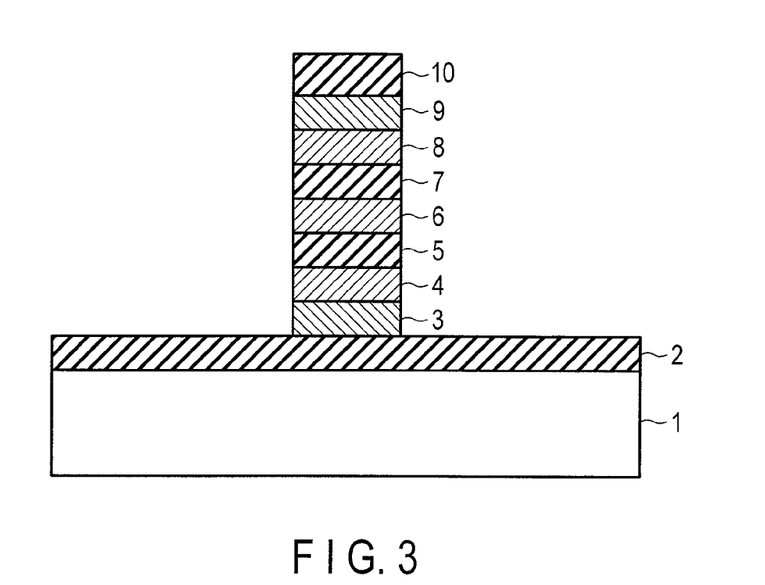
FIG. 3 is a sectional view to explain the method for manufacturing the semiconductor device including the MTJ element according to the first embodiment following FIG. 2.

[FIG. 3]

the upper electrode 9, the second fixed layer 8, the second tunnel barrier layer 7, the free layer 6, the first tunnel barrier layer 5, the first fixed layer 4, and the lower electrode 3 which have a specific shape are formed by etching the MTJ by RIE method using the hard mask 10 as a mask. Hereinafter, the MTJ stacked layer and the hard mask 10 after this etching is called an MTJ element portion.

Figure 4:
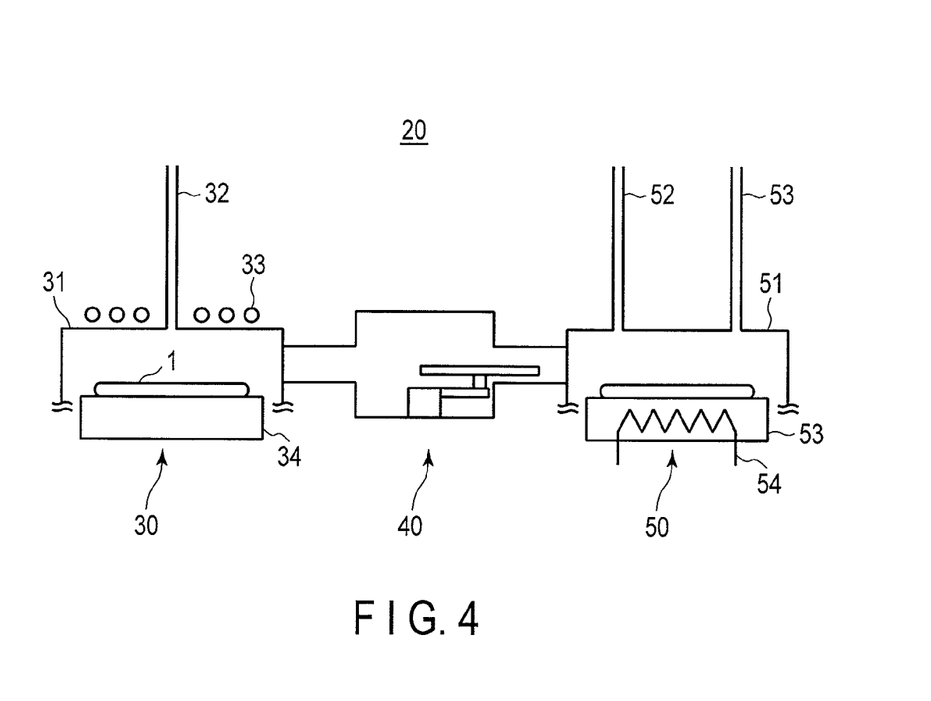
FIG. 4 schematically shows a semiconductor manufacturing apparatus used in the first embodiment.

The MTJ stacked film is etched by using a semiconductor manufacturing apparatus 20 shown in FIG. 4. The semiconductor manufacturing apparatus 20 comprises an etching apparatus 30 for etching (RIE) the MTJ stacked film (RIE), a vacuum conveyance system 40 connected to the etching apparatus 30, and a gas processing apparatus 50 connected to the etching apparatus 30 via the vacuum conveyance system 40.

Next, the etching apparatus 30 used in the present step will be explained.

The etching apparatus 30 comprises a plasma processing chamber 31 where etching gas is introduced and etching is performed. The plasma processing chamber 31 is configured to be vacuumized by a vacuum pump (not shown). In addition, a pipe 32 for introducing source gas (etching gas) is provided on the upper wall of the plasma processing chamber 31. An upper coil 33 is provided outside the plasma processing chamber 31 so as to surround the pipe 32. The upper coil 33 is connected to an RF (high frequency) power supply (not shown) related to plasma excitation. The frequency of the RF power supply is, for example, 2.45 GHz. In the plasma processing chamber 31, there is provided an electrode 34 on which a silicon wafer 1 is placed. The electrode 34 on which the silicon wafer 1 is placed is connected to an RF (high frequency) bias power supply (not shown) related to drawing positive ions from plasma. The frequency of the RF bias power supply is, for example, 2 MHz.

The etching (RIE) of MTJ stacked film by using the etching apparatus 30 is as follows.

While the plasma processing chamber 31 is pumped out to the atmosphere, $Cl_2$ is introduced into the plasma processing chamber 31 via the pipe 32. The flow rate of the $Cl_2$ is, for example, 200 SCCM. The pressure of the $Cl_2$ is, for example. While introducing the $Cl_2$ as describe above, the upper coil 33 is supplied with electric power by the RF power supply, which results in producing plasma of $Cl_2$. The electric power is, for example, 1000 W. While producing the plasma of $Cl_2$ as describe above, the electrode 34 is supplied with high-frequency electric power, which results in drawing the ions ($Cl^-$) from the plasma into the electrode 34 and etching the MTJ stacked film. The etching time is, for example one minute.

Not only $Cl_2$ but also, halogen compound gas, such as HCl or $BCl_3$, may be used as the etching gas.

In addition, inert gas, such as Ar, He, or Xe, may be added to the etching gas, such as $Cl_2$, HCl, or $BCl_3$.

Furthermore, a small amount of oxidizing or nitriding gas, such as $O_2$ or $N_2$, may be added to the etching gas.

Figure 5A:
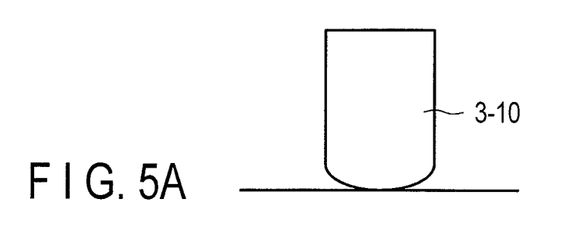
FIGS. 5A and 5B are sectional views of a notch shape and an undercut shape in a lower part of an MTJ element portion, respectively.
Figure 5B:
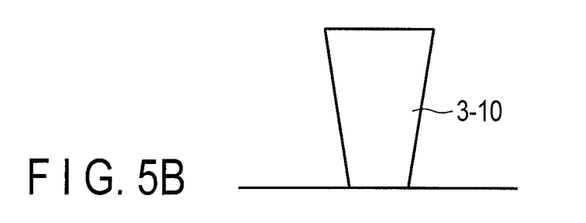

Still furthermore, to obtain a desired processed shape (i.e., a vertical shape), various gases may be added to the etching gases. It is confirmed that a notch shape in a lower part of the MTJ element portion 3-10 as shown in FIG. 5A and an undercut shape in the lower part of the MTJ element portion 3-10 as shown in FIG. 5B are easy to cause the reduction of signal amount resulting from the corrosion.

The pressure of etching gas is in a range of, for example, 0.5 Pa to 3 Pa, or 1 Pa to 2 Pa. The electric power of the upper coil is in a range of, for example, 200 W to 4000 W, or 500 W to 1500 W. The bias power is in a range of, for example, 300 W to 600 W, or 300 W to 400 W.

After the etching, as shown in FIG. 3, the ferromagnetic material (e.g., Co, Fe, or Ni) on the side surfaces of the first fixed layer 4, the free layer 6, and the second fixed layer 8 are exposed.

Figure 6:
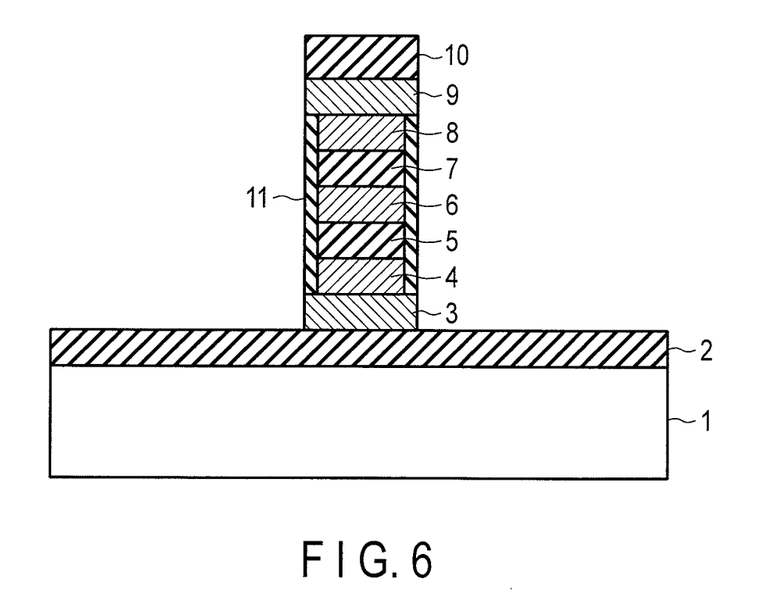
FIG. 6 is a sectional view of a damaged layer formed in a region including side surface of an MTJ element portion when a silicon wafer is taken out of a plasma processing chamber and brought into the air after etching.

After the etching, the silicon wafer is temporarily taken out of the plasma processing chamber (or etching apparatus) into the air in the conventional art. Chlorine is adsorbed on the side surface of the MTJ element portion obtained by etching using chlorine. Therefore, if the silicon wafer is taken out of the plasma processing chamber and brought into the air after the etching, a region including the side surface of the MTJ element portion is corroded by such a chemical process as the reaction between chlorine adsorbed on the side surface and moisture in the air, which results in forming a damaged layer 11 in the region including the side surface of the MTJ element portion as shown in FIG. 6. The damaged layer 11 includes oxide of ferromagnetic material, ferromagnetic material destroyed by oxidation, or the like. Such a deterioration of the ferromagnetic material has an adverse effect on the operation of the MTJ element. Corrosion also arises in the tunnel barrier layers 5, 7, thus the damaged layer 11 is also formed on the tunnel barrier layers 5, 7.

Figure 7:
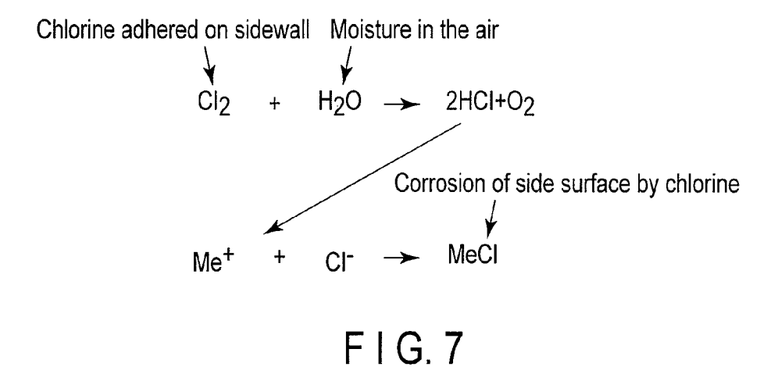
FIG. 7 is a diagram to explain a process how the corrosion is generated on a side surface of the MTJ element portion by the reaction between the chlorine adsorbed on the side surface and moisture in the air.

FIG. 7 is a diagram to explain a process how the corrosion is generated on the side surface by the reaction between the chlorine adsorbed on the side surface and the moisture in the air. In FIG. 7, $Me^+$ represents ion of metal (e.g., Co, Fe, or Ni) constituting the side surface of the MTJ element portion. $Me^+$ represents ionized metal, not representing only metal ion whose ionic valency is plus one. The ionic valency may change, depending on the type of metal. In addition, like Fe, one metal may take a different valency, such as two or three.

Since the damaged layer 11 is as thick as several tens of nanometers, a current leak occurs or the magnetization characteristic becomes impaired, which results in a serious problem in the operation of the MTJ element. In addition, after the process of forming the MTJ element, a process of forming an interlayer insulating film is performed, then the damaged layer 11 causes a problem that the interlayer insulating film is peeled off. As a result, for example, during a process of forming an interlayer insulating film (e.g., silicon oxide film) located higher than the above mentioned interlayer insulating film, a source gas (e.g. oxygenic gas) infiltrates into a space between the interlayer insulating film and the MTJ element, which results in a deterioration of the MTJ element by oxidation for instance, and a problem of operation of the MTJ element is caused.

Thereupon, in the present embodiment, the semiconductor manufacturing apparatus 20 shown in FIG. 4 is used to perform a flowing process in order to sufficiently decrease the thickness of damaged layer 11 on the side surface and to prevent the silicon wafer 1 from being damaged by corrosion even if the silicon wafer 1 is exposed to the air.

After the MTJ stacked film is etched by using the etching apparatus 30, the silicon wafer 1 in the etching apparatus 30 is moved into the gas processing apparatus 50 via the vacuum conveyance system 40. Since the silicon wafer 1 is moved from the etching apparatus 30 to the gas processing apparatus 50 via the vacuum conveyance system 40, the silicon wafer 1 is not exposed to the air. Accordingly, the reaction between chlorine adsorbed on the side surface of the MTJ element portion and the moisture in the air is suppressed sufficiently, which results in suppressing the generation of the damaged layer. Even if the damaged layer is formed, it is so thin that there is no problem in the operation of the MTJ element.

The vacuum conveyance system 40 may have a known configuration and therefore the silicon wafer 1 is moved from the etching apparatus 30 to the vacuum conveyance system 40 by, for example, a robot arm provided on the vacuum conveyance system 40. Similarly, the silicon wafer 1 is moved from the vacuum conveyance system 40 to the gas processing apparatus 50 by a robot arm.

When the silicon wafer 1 is transported into the gas processing apparatus 50, a gas treatment is performed using a gas containing an amino group.

The gas processing apparatus 50 comprises a gas processing chamber 51 where a gas treatment is performed. On the upper wall of the gas processing chamber 51, there is provided a first pipe 52 for introducing gas containing amino group. In the gas processing chamber 51, there is provided a stage 53 on which a silicon wafer is to be placed. A heater 54 is provided inside the stage 53.

In the present embodiment, TMSDMA (trimethylsilyldimethylamine) is used as a gas containing amino group. In addition to this, an organic gas containing an amino group, such as DMSDMA (dimethylsilyldimethylamine) or BDMADMS (bis(dimethylamino)dimethylsilane), may be used. Furthermore, the following may be used: N-(trimethylsilyl)diethylamine ($C_7H_{19}NSi$), N-benzyltrimethylsilylamine ($C_{10}H_{17}Si$), Bis(dimethylamino)dimethylsilane ($C_6H_{18}N_2Si$), 1,2-bis[(dimethylamino)dimethylsilyl]ethane (C10H28N2Si2), 3-(2-aminoethylamino)propyl-dimethoxymethylsilane ($C_8H_{22}N_2O_2Si$), 3-(2-aminoethylamino)propyltriethoxysilane ($C_{11}H_{28}N_2O_3Si$), N-(2-aminoethylamino)propyltrimethoxysilane ($C_8H_{22}N_2O_3Si$)), 3-aminopropyldiethoxymethylsilane ($C_8H_{21}NO_2Si$), 3-aminopropyltriethoxysilane ($C_9H_{23}NO_3Si$), 3-aminopropyltrimethoxysilane ($C_6H_{17}NO_3Si$), and trimethoxy[3-(phenylamino)propyl]silane ($Cl_2H_{21}NO_3Si$).

Since the vapor pressure of TMSDMA is low, the container for TMSDMA is heated to about 50° C. and a mixed gas of vaporized gas and $N_2$ gas is used. Processing conditions may be selected according to the type of processing gas. For example, the flow rate of TMSDMA supplied from the first pipe 52 is set to 0.1 to 1.0 g/min, the flow rate of $N_2$ gas is set to 1.67 to 16.7 Pa·m$^3$/s (1 to 10 slm), the flow rate of water supplied from the second pipe 53 is set to 16.7 to 167 mPa·m$^3$/s (10 to 100 SCCm), and the processing pressure in the gas processing chamber 51 is set to 666 to 96000 Pa (5 to 720 Torr).

In the gas treatment, the temperature of the wafer heated by the heater 54 is in a range of, for example, 50° C. to 200° C., or 80° to 180° C. The silicon wafer 1 may be heated before a mixed gas of TMSDMA and $N_2$, and water are supplied to the gas processing chamber 51. In addition, the silicon wafer 1 may be heated to a desired temperature even after the mixed gas of TMSDMA and $N_2$, and water are supplied to the gas processing chamber 51. For example, the inside of gas processing chamber 51 is depressurized to be a pressure lower than 666 Pa (5 Torr), thereafter, the mixed gas of TMSDMA and $N_2$, and water are supplied to the gas processing chamber 51 until the pressure of the inside of gas processing chamber 51 is to be 666 Pa (5 Torr), the pressure is kept for, for example, three minutes and the wafer 1 is processed.

As described above, in the present embodiment, TMSDMA gas and water are supplied to the silicon wafer 1 via the first pipe 52 and second pipe 53, respectively.

Figure 8:
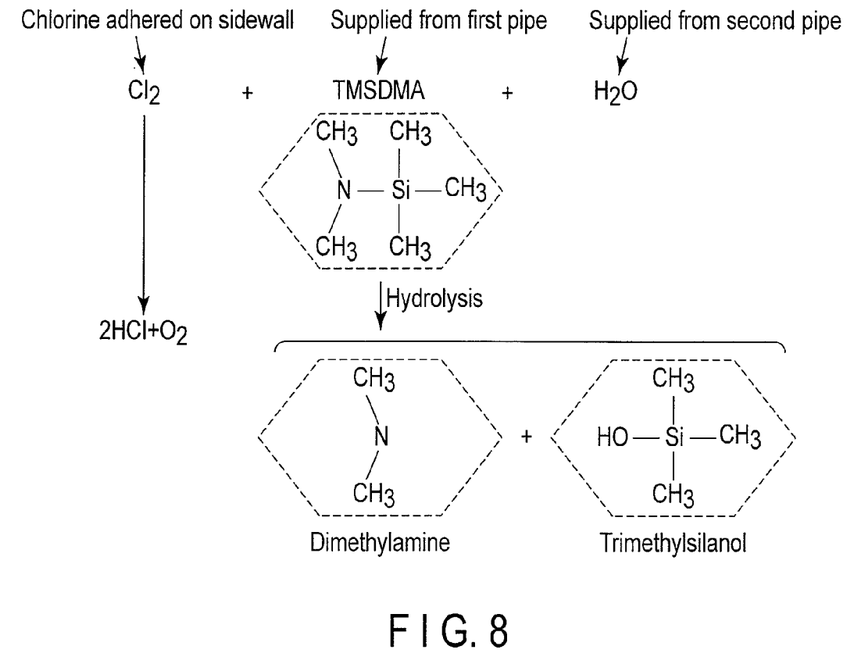
FIG. 8 is a diagram to explain the reason why the formation of the damaged layer is suppressed.

As shown in FIG. 8, chlorine adsorbed on the side surface of the MTJ element portion reacts with water supplied from the second pipe to form hydrogen chloride (HCl). On the other hand, TMSDMA gas is hydrolyzed by water supplied from the second pipe to form dimethylamine and trimethylsilanol.

Figure 9:
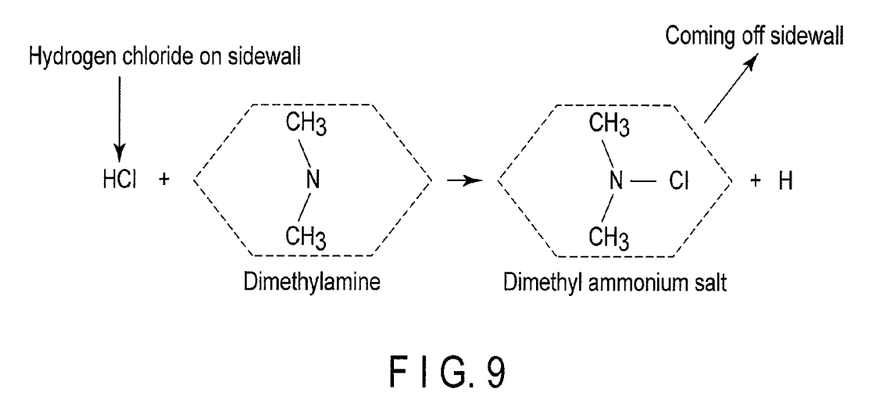
FIG. 9 is a diagram to explain the reason why the formation of the damaged layer is suppressed following FIG. 8.

As shown in FIG. 9, chlorine (Cl) in hydrogen chloride (HCl) formed on the side surface of the MTJ element portion reacts with dimethylamine formed by hydrolysis to form dimethyl ammonium salt, which comes off the side surface. As a result, the amount of chlorine remaining on the side surface which contributes to the corrosion can be reduced sufficiently, and hence the generation of corrosion on the MTJ element portion is suppressed.

Figure 10:
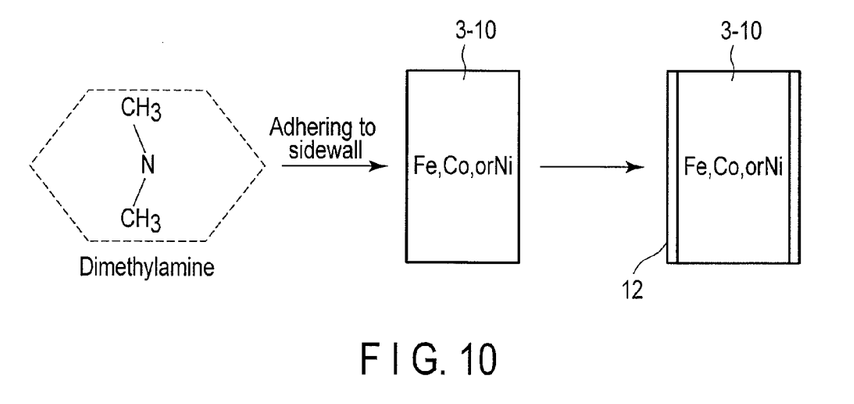
FIG. 10 is a diagram to explain the reason why the formation of the damaged layer is suppressed following FIG. 9.

Further, as shown in FIG. 10, dimethylamine formed by hydrolysis adheres on a region including the exposed surface (the side surfaces of the first fixed layer 4, the free layer 6, and the second fixed layer 8) of the ferromagnetic material (Fe, Co, or Ni) of the MTJ element portion 3-10, which forms a protective layer 12 made of dimethylamine.

Since dimethylamine has a water-repellent property, the protective layer 12 has a water-repellent property. The protective layer 12 having water-repellent property suppresses deterioration of the magnetic material constituting the first fixed layer 4, the free layer 6, and the second fixed layer 8, such as oxidation resulting from moisture absorption, even if the magnetic material is exposed to the air.

Accordingly, when the silicon wafer 1 is taken out of the gas processing apparatus 50 and exposed to the air in order to perform the next process (e.g., the process of forming an interlayer insulating film) after the gas treatment of the present embodiment, the first fixed layer 4, the free layer 6, and the second fixed layer 8 are sufficiently suppressed to be deteriorated by oxidation due to the moisture absorption of the layers 4, 6, and 8.

When Fe is used as a ferromagnetic material, and ferric chloride ($FeCl_2$) is on a surface of Fe, dimethylamine hydrochloride (($CH_3$)$_2$NH.HCl)) is also formed. Dimethylamine hydrochloride is soluble in organic solvent. Therefore, when it is washed by using organic solvent, such as acetone, ether, chloroform, or benzene after the gas treatment of the present embodiment, the corrosion resistance is further improved.

Figure 11:
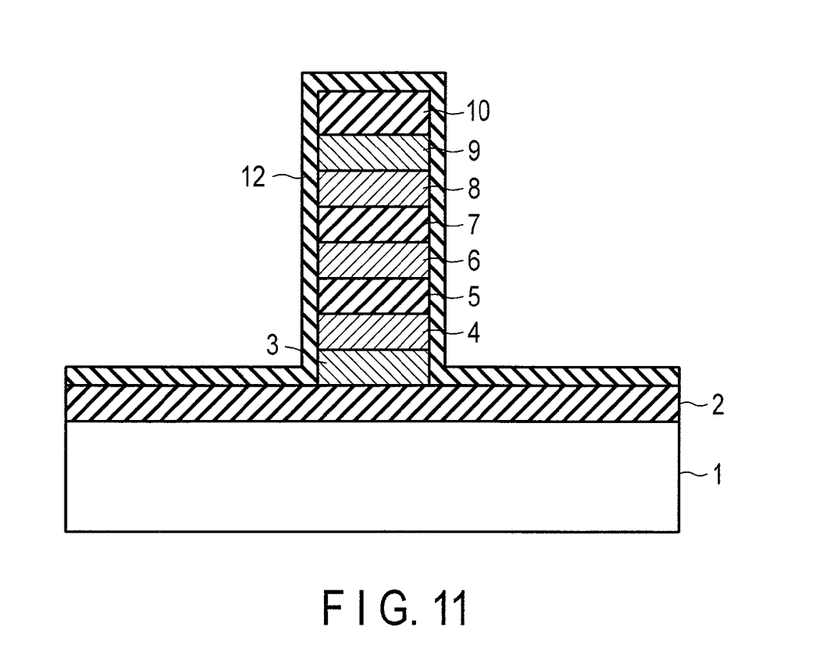
FIG. 11 is a sectional view of a region where a protective layer is to be formed.

Dimethylamine constituting the protective layer 12 is a chemically stable substance. Therefore, dimethylamine is deposited on the side surface to form a protective layer 12 instead of reacting chemically with the side surface to form a protective layer 12. Accordingly, as shown in FIG. 11, after the gas treatment of the first embodiment, the protective layer 12 may be formed not only on the side surface of the MTJ element portion but also on the top surface of the MTJ element portion and on the interlayer insulating film 2.

There is one known method of performing nitriding treatment to the MTJ element portion obtained by processing the MTJ stacked film, in which amine (produced by replacing hydrogen of ammonia with one or more organic atom groups) such as triethylamine is brought into a plasma state.

However, in the case of this method, when triethylamine is brought into a plasma state, not only amine but also nitrogen atoms and others are generated. Nitrogen atoms cause the problem of nitriding the surface of ferromagnetic materials and damaging the ferromagnetic characteristic of the MTJ element.

In contrast, in the case of the present embodiment, the gas containing amino groups not being brought into to a plasma state is introduced into the gas processing chamber 51, thus the damage due to the nitriding does not arise.

In addition, a method for improving the surface of a low-k interlayer insulating film using trimethyldimethylamine is known. In this improving method, after an interlayer insulating film made of SiOC which is low-k material, is etched and subject to ashing, the resulting film is processed in an atmosphere of TMSDM (trimethyldimethylamine) to repair the damage of SiOC. At this time, the methyl groups of TMS-DMA combine with SiOC to repair the damage.

Although TMSDMA is used in the present embodiment, the object to be processed is the MTJ element, more specifically, the metal, such as Co, Fe, or Ni, constituting the MTJ element. The object to be processed in the present embodiment is not the insulating material (SiOC) constituting the low-k insulating film. Moreover, in the present embodiment, the purpose of the process using TMSDMA is to suppress the deterioration of the characteristic of the MTJ element (i.e., a decrease in the signal amount or a decrease in the rate of magnetoresistance change (MR ratio)), not to improve the surface of the low-k insulating film.

After the MTJ element is formed by the above method, a known process for manufacturing semiconductor device is performed to obtain an MRAM, in which the known process includes forming an interlayer insulating film on a region including the MTJ element, forming a contact hole connected to the upper electrode 9, and forming a contact plug in the contact hole.

(Second Embodiment)

Next, a method for manufacturing a semiconductor device according to a second embodiment will be explained. In the drawings below, those corresponding to the diagrams already explained are indicated by the same reference numerals and a detailed explanation of them will be omitted.

Figure 12:
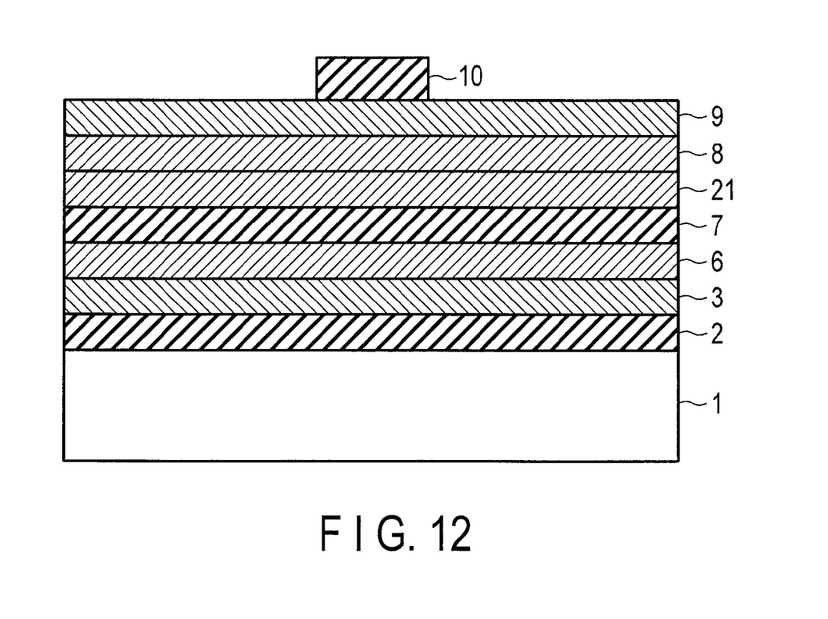
FIG. 12 is a sectional view to explain a method for manufacturing a semiconductor device including an MTJ element according to a second embodiment.

[FIG. 12]

An interlayer insulating film 2 is formed on a silicon wafer 1, then, a lower electrode 3, a free layer (a first layer) 6, a tunnel barrier layer (a nonmagnetic layer) 7, a stopper layer 21, a fixed layer (a second layer) 8, and an upper electrode 9 are formed sequentially on the interlayer insulating film 2, by sputtering method.

In the present embodiment, Pt is used as a material (metal) of the lower electrode 3 and upper electrode 9, composite material (CoFeB) of Co, Fe, and B is used as a material of the free layer 6, Ru is used as a material of the stopper layer 21, MgO is used a material of the tunnel barrier layer 7, and composite material (CoPt) of Co and Pt is used as a material of the fixed layer 8. In addition to Ru, for example, Ir or Ir oxide may be used as a material of the stopper layer 21.

Thereafter, a hard mask 10 is formed on the upper layer 9 by, for example, the same process as in the first embodiment.

Next, an etching process is performed. In the present embodiment, etching is performed by using a semiconductor manufacturing apparatus 20' shown in FIG. 13. The semiconductor manufacturing apparatus 20' of the second embodiment differs from the semiconductor manufacturing apparatus 20 explained in the first embodiment in that an ion beam etching (IBE) apparatus 60 instead of the gas processing apparatus 50 is connected to the vacuum conveyance system 40. The IBE apparatus 60 will be explained further later.

Figure 14:
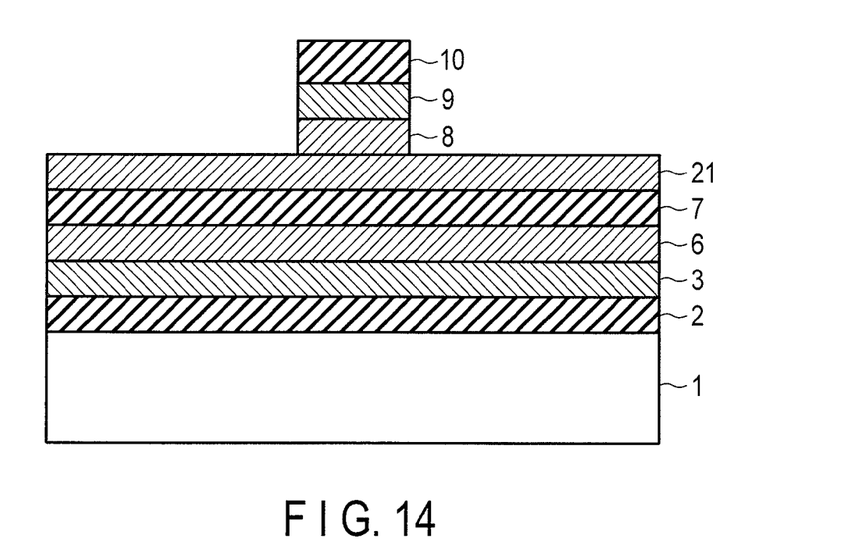
FIG. 14 is a sectional view to explain the method for manufacturing the semiconductor device including the MTJ element according to the second embodiment following FIG. 13.

[FIG. 14]

As in the first embodiment, by using the etching apparatus 30, the upper electrode 9 and fixed layer 8 are processed by RIE method using the hard mask 10 as a mask.

The conditions (etching conditions) of electric power, frequency, type of gas, and flow rate are the same as those in the first embodiment. The etching time (etching condition) is, for example, 20 seconds, shorter than that (e.g., one minute) in the first embodiment. The reason is that, while in the first embodiment, all the layers from the upper electrode 9 to the lower electrode 3 are processed by RIE method using halogen by using the etching apparatus 30, only two layers, the upper electrode 9 and fixed layer 8, are processed by RIE method using halogen in the present embodiment.

In the above RIE process, the stopper layer 21 functions as an etching stop layer. Therefore, the tunnel barrier layer 7 and the free layer 6 under the stopper layer 21 are not etched.

When the stopper layer 21 is not used (conventional), the tunnel barrier layer 7 and the free layer 6 are etched into a predetermined shape and chlorine is adsorbed on the sidewalls of the tunnel barrier layer 7 and the free layer 6. When chlorine adsorbed on the sidewalls is exposed to the air, moisture in the air reacts with chlorine, which results in a continuous progress of corrosion toward the inner parts of the tunnel barrier layer 7 and the free layer 6. As a result, the magnetization characteristic of the free layer 6 and the electrical characteristic of the tunnel barrier layer 7 are impaired, and a serious problem (damage) relating to the operation of the MTJ element occurs.

It is noted that the problem resulting from the RIE process using halogen is avoided for the lower electrode 3 even if the stopper layer 21 is not used. One of the reasons is that the lower electrode 3 (material: Ru) can have a sufficiently low etching selectivity for the tunnel barrier layer 7 (material: MgO) and the free layer 6 (material: CoFeB). Moreover, it is because Ru, the material of the lower electrode 3, is not oxidized or presents an electrical conductivity even if oxidized.

In the present embodiment, the etching of the upper electrode 9 and fixed layer 8 is stopped at the stopper layer 21, and then the problem of the corrosion of the tunnel barrier layer 7 and the free layer 6 resulting from the RIE process using halogen is avoided.

While in the present embodiment, the material (CoPt) of the fixed layer 8 differs from the material (Ru) of the stopper layer 21, the material of the fixed layer 8 may be the same as that of the stopper layer 21. For example, Ru may be used as a material for both the fixed layer and stopper layer. In this case, when etching reaches the stopper layer 21, the etching is caused to stop at the stopper layer 21 by, for example, changing gas.

Figure 13:
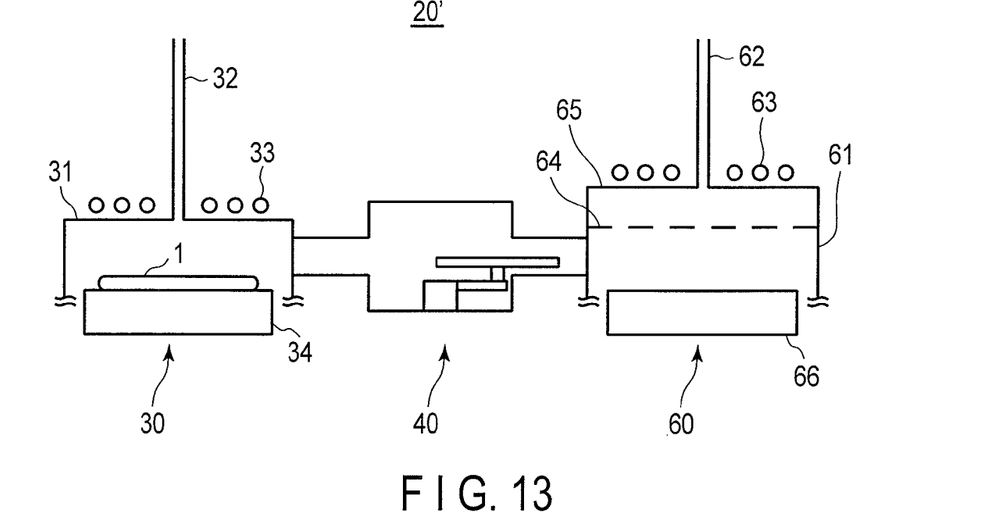
FIG. 13 schematically shows a semiconductor manufacturing apparatus used in the second embodiment.

After the upper electrode 9 and fixed layer 8 are etched by the etching apparatus 30, the silicon wafer 1 in the etching apparatus 30 is moved to the IBE apparatus 60 via the vacuum conveyance system 40. Since the transferring of the silicon wafer 1 from the etching apparatus 30 to the IBE apparatus 60 is performed via the vacuum conveyance system 40, the silicon wafer 1 is not exposed to the air. Accordingly, the reaction between chlorine adsorbed on the sidewalls of the upper electrode 9 and fixed layer 8 and moisture is sufficiently suppressed. Thereby, even if the damaged layer is formed, its thickness is sufficiently thin, and hence the serious problem relating to the operation of the MTJ element will not occur.

Figure 15:
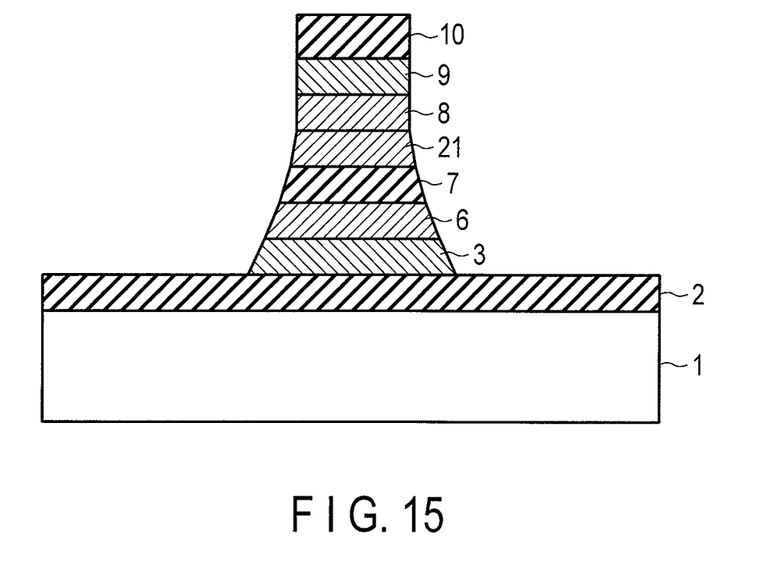
FIG. 15 is a sectional view to explain a method for manufacturing a semiconductor device including the MTJ element according to the second embodiment following FIG. 14.

[FIG. 15]

When the silicon wafer 1 is moved into the IBE apparatus 60, the stopper layer 21, the tunnel barrier layer 17, the free layer 6, and lower electrode 3 are subjected to IBE.

The IBE apparatus 60 of FIG. 13 comprises an IBE chamber 61 where IBE is performed. A gas intake 62 for introducing inert gas, such as argon (Ar), is provided at the upper wall of the IBE chamber 61. An upper coil 63 is provided outside the IBE chamber 61 so as to surround the gas intake 62. The upper coil 63 is connected to an RF (high frequency) power supply (not shown) related to the excitation of high-density plasma. The IBE chamber 61 is separated into an upper and a lower space by a grid 64. The upper space is a chamber (ionizing chamber) 65 for exciting plasma of inert gas, such as Ar, to generate ions. The grid 64 is configured to be set to a negative electrical potential by a power supply (not shown). When the grid 64 is set to a negative electrical potential, positive ions, such as $Ar^+$, generated in the ionizing chamber 65 are drawn into the lower space, and ion beams for etching are generated. In the IBE chamber 61 below the grid 64, there is provided a stage 66 on which the silicon wafer 1 is to be placed.

The stopper layer 21, the tunnel barrier layer 7, the free layer 6, and the lower electrode 3 are etched by the IBE apparatus as follows.

Ar is introduced from the gas intake 62 into the ionizing chamber 65, and an RF power is applied to the upper coil 63 to excite high-density plasma in the ionizing chamber 65. Then, the electrical potential of the grid 64 is set negative and $Ar^+$ is drawn from the high-density plasma to generate the ion beams, thereby the stopper layer 21, the tunnel barrier layer 7, the free layer 6, and the lower electrode 3 are sequentially etched (IBE). In the case of IBE, the sidewalls of the stacked body of the stopper layer 21, the tunnel barrier layer 7, the free layer 6, and the lower electrode 3 have, for example, a taper shape as shown in FIG. 15.

Since the stopper layer 21, the tunnel barrier layer 7, the free layer 6, and the lower electrode 3 are etched without using a halogen gas, such as $Cl_2$, even if they are exposed to the air, an alteration layer (corrosion layer, oxidation layer) is not formed on the sidewalls of the tunnel barrier layer 7 and the free layer 6. Even if an alteration layer is formed on the sidewalls, no problem occurs with the operation of the MTJ element, because the alteration layer is sufficiently thin.

In the present embodiment, the upper electrode 9 and fixed layer 8 are processed by RIE, not by IBE. One of the reasons is because RIE has a higher etching rate than that of IBE and is superior to IBE in throughput (productivity). All of the MTJ stacked film may be processed by IBE, provided that a necessary throughput is obtained.

In contrast to the second embodiment, the upper electrode 9 and fixed layer 8 may be processed by RIE and the remaining layers by IBE. That is, the layers to be processed by RIE and those to be processed by IBE may be changed as needed.

While the embodiments of the invention have been explained, the invention is not limited to the embodiments. For example, in the first embodiment, an MTJ element with two fixed layers and two tunnel barrier layers (or with a dual pin layer structure (also called a double junction structure)) is explained. In the second embodiment, an MTJ element with a fixed layer and a tunnel barrier layer has been explained. However, the method for the first embodiment may be applied to the MTJ element of the second embodiment. In addition, the method for the second embodiment may be applied to the MTJ element of the first embodiment.

While in the first and second embodiments, the planar shape of an MTJ element is not particularly referred to, the planar shape may be, for example, not only round but also square, rectangular, or ellipse.

Furthermore, in the first embodiment, a synthetic antiferromagnet (SAF) structure may be applied to the first and second fixed layers. The SAF structure is a stacked structure comprising a first magnetic layer/nonmagnetic layer/a second magnetic layer whose magnetization directions are opposite via the nonmagnetic layer. Using of the SAF structure increases the magnetic fixing strength of the first and second fixed layers, which improves the resistance to an external magnetic field and a thermal stability.

Furthermore, in the first embodiment, the stacking order of layers constituting the MTJ element may be reversed. In this case, paramagnetic metal is used for the first tunnel barrier layer 5 and metal oxide is used for the second tunnel barrier layer 7. In addition, metal oxide may be used for each of the first tunnel barrier layer 5 and second tunnel barrier layer 7. In this case, the first tunnel barrier layer 5 and second tunnel barrier layer 7 are made different from each other in film thickness. The reason for this is to cause them to have different MR ratios in reading data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the device comprising a magnetoresistance effect element using magnetic material containing at least one of cobalt, iron, and nickel, forming the magnetoresistance effect element comprising:

forming a stacked body above a semiconductor substrate, the stacked body comprising a plurality of layers comprising the magnetic material;

processing the stacked body in a vacuum atmosphere by plasma etching using a first gas containing chlorine; and after processing the stacked body, subjecting the stacked body to a gas treatment using a second gas containing an amino group while holding the stacked body in the vacuum atmosphere.

2. The method of claim 1, wherein the first gas is $Cl_2$, HCl, or $BCl_3$ gas, the plasma etching is reactive ion etching, the second gas contains TMSDMA (trimethylsilyldimethylamine), DMSDMA (dimethylsilyldimethylamine), or BDMADMS (bis(dimethylamino)dimethylsilane) gas, and the gas treatment is a process for suppressing a generation of corrosion on the plurality of layers.

3. The method of claim 1, wherein the magnetoresistance effect element is a magnetic tunnel junction (MTJ) element, and the plurality of layers comprising a first fixed layer, a free layer, and a second fixed layer.

4. The method of claim 3, wherein each of the first fixed layer, the second fixed layer, and the free layer comprises a ferromagnetic layer.

5. The method of claim 3, wherein each of the first fixed layer and the second fixed layer comprises at least one of cobalt (Co), iron (Fe), nickel (Ni), iridium (Ir), platinum (Pt), manganese (Mn), and ruthenium (Ru).

6. The method of claim 3, wherein the free layer comprises at least one of cobalt (Co), iron (Fe), and nickel (Ni).

7. The method of claim 6, wherein the free layer further comprises boron (B), carbon (C), or silicon (Si).

8. The method of claim 3, wherein the MTJ element comprises a lower electrode under the first fixed layer, and an upper electrode on the second fixed layer, and wherein each of the lower electrode and the upper electrode comprises platinum (Pt), iridium (Ir), or ruthenium (Ru).

9. The method of claim 3, wherein the semiconductor substrate comprises a main surface on which the MTJ element is formed, and wherein the MTJ element on the main surface comprises a side surface perpendicular to the main surface.

10. A method for manufacturing a semiconductor device, the device comprising a magnetoresistance effect element using magnetic material containing at least one of cobalt, iron, and nickel, forming the magnetoresistance effect element comprising:

forming a first layer comprising the magnetic material;

forming a second layer comprising the magnetic material above the first layer;

forming a stopper film between the first layer and the second layer, the stopper film having resistance to plasma etching using a first gas containing chlorine;

after forming the stopper film, processing the second layer by the plasma etching; and processing the first layer by ions, the ions being generated by ionizing second gas precluding chlorine.

11. The method of claim 10, wherein the stopper film is a ruthenium oxide film, an iridium film, or an iridium oxide film.

12. The method of claim 10, wherein a series of processing from the processing the first layer to the processing the second layer is performed in a vacuum atmosphere.

13. The method of claim 10, wherein the magnetoresistance effect element is a magnetic tunnel junction element, the first layer is a free layer, and the second layer is a fixed layer.

14. The method of claim 10, wherein the magnetoresistance effect element is a magnetic tunnel junction element, the first layer is a first fixed layer, and the second layer is a second fixed layer.

15. The method of claim 10, wherein the stopper film comprises ruthenium (Ru), iridium (Ir), or an iridium (Ir) oxide.

16. The method of claim 10, wherein the plasma etching is reactive ion etching.

17. The method of claim 10, wherein the ions are ions of inert element.

* * * * *